United States Patent [19]

Ryan

[11] Patent Number: 4,521,736
[45] Date of Patent: Jun. 4, 1985

[54] DEMODULATOR FOR PULSE WIDTH MODULATED SIGNALS

[75] Inventor: John O. Ryan, Cupertino, Calif.

[73] Assignee: Ampex Corporation, Redwood City, Calif.

[21] Appl. No.: 37,554

[22] Filed: May 9, 1979

[51] Int. Cl.³ .............................................. H03D 1/18
[52] U.S. Cl. .................................. 329/102; 329/106; 307/246; 375/94
[58] Field of Search .................. 329/106, 102, 101; 307/234, 246; 375/94, 95

[56] References Cited

U.S. PATENT DOCUMENTS 2,421,025  5/1947  Grieg .................................. 329/106
3,473,050 10/1969  Groom ................................ 329/106

OTHER PUBLICATIONS

Ferrie, Ronald, "Designers Casebook", Electronics, 4/19/1965, pp. 90-91.

Primary Examiner—Eugene R. LaRoche
Assistant Examiner—Robert J. Pascal
Attorney, Agent, or Firm—George B. Almeida; Joel D. Talcott

[57] ABSTRACT

A simple demodulator circuit for demodulating high frequency pulse width modulated carrier signals, includes means for charging a capacitor to charge levels commensurate with the pulse widths. Output switch means, biased at the verge of conduction, discharge the capacitor charge at the ends of the pulses as an exponential signal with given time constant. Since the amplitudes of successive exponential signals are proportional to the respective capacitor charge levels, the charge levels are simultaneously read during the discharge process, thereby allowing demodulation at very high speeds.

9 Claims, 4 Drawing Figures

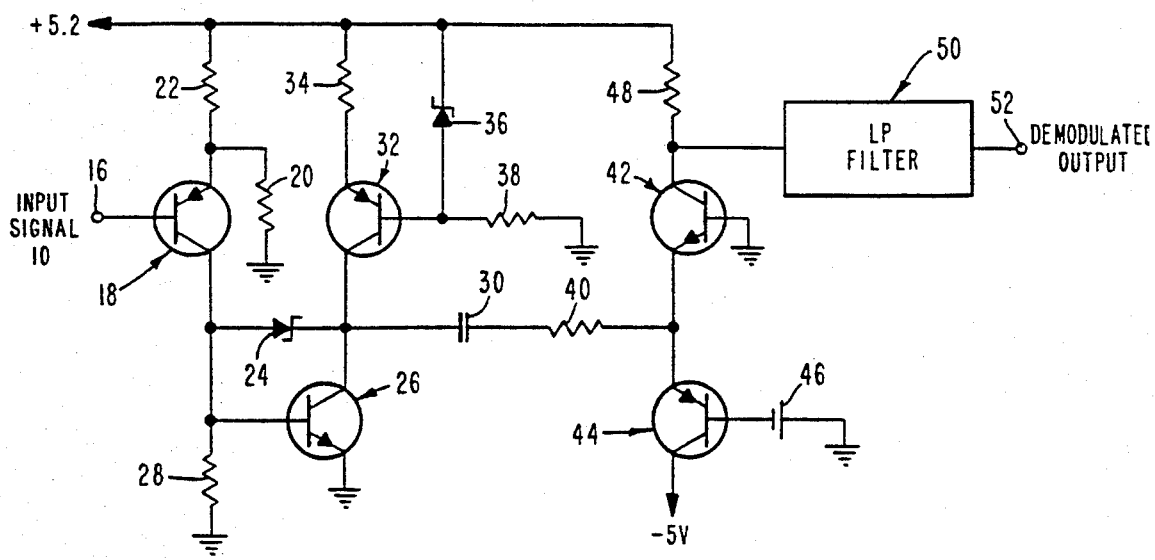
FIG_1
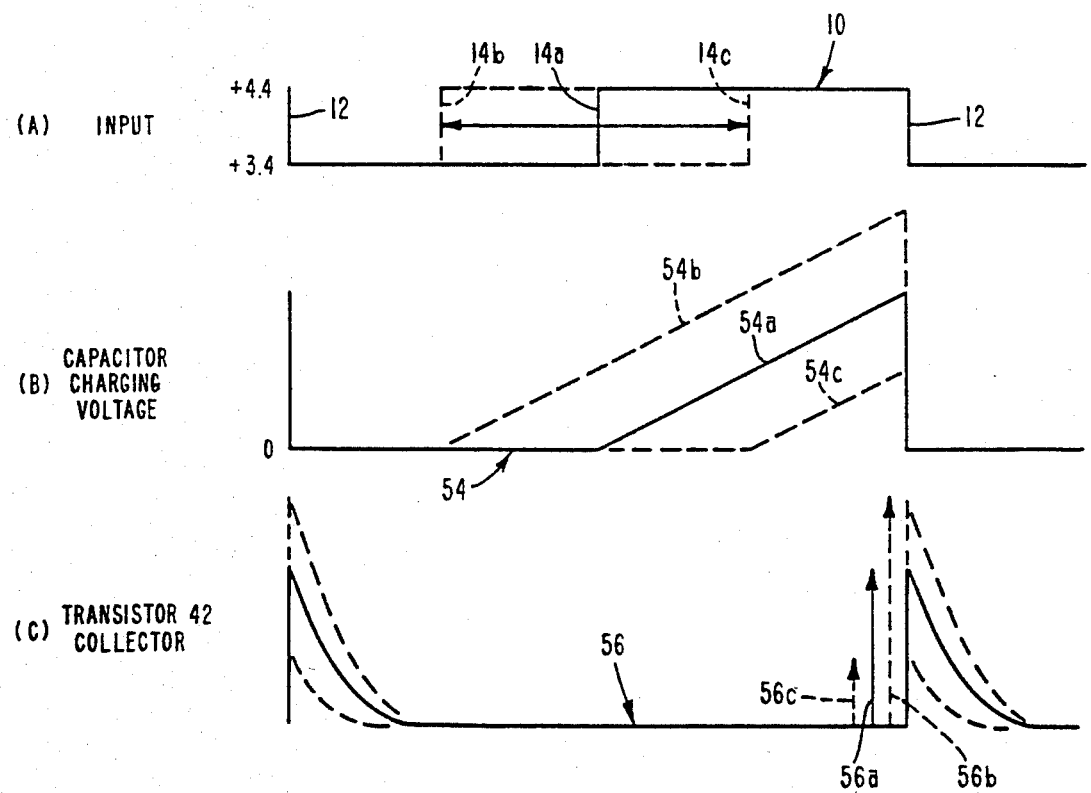
FIG_2

DEMODULATOR FOR PULSE WIDTH MODULATED SIGNALS

BACKGROUND OF THE INVENTION

1. Field

The invention relates to demodulators, and particularly to a circuit for demodulating a pulse width modulated carrier signal at very high speeds.

2. Prior Art

There exist many variations of circuits which demodulate a pulse width modulated type of carrier signal. Typical of existing pulse width demodulators are those circuits which use a three stage approach. First, a capacitor is allowed to charge for a period equal to the duration of the pulse. Second, when the pulse has ended, the voltage level on the capacitor is read by a clock which is locked to the carrier. Third, after sufficient time has elapsed to allow the voltage level to be read, the capacitor is then discharged in preparation for the next pulse. The sampled voltage is filtered and becomes the demodulated signal.

At frequencies above a few megahertz (MHz), the implementation of the above demodulator is difficult if accurate demodulation is required, since the process of separately reading the voltage level on the capacitor and thereafter discharging the capacitor takes a prohibitive amount of time.

SUMMARY OF THE INVENTION

The invention overcomes the problems of the prior art above, by providing a simple and precise circuit for demodulating high frequency pulse width modulated carriers, which performs the capacitor read and discharge functions simultaneously, to allow very high speed operation of the order of 100 megahertz on carrier signals. In effect, the circuit defines a time-to-voltage converter.

To this end, in the presence of a low input signal corresponding to the absence of a pulse, input switch means feeds the current from a current source to ground. When the input signal goes high, indicating the presence of the leading edge of a pulse, the input switch means is cut off and the current source charges a capacitor to a charge level proportional to the time during which the pulse is high, i.e., to the pulse width. One of a pair of output transistors, biased at the verge of conduction, allows the capacitor charging current to flow in one direction through the capacitor as long as the input signal is high. When the input signal goes low again, the input switch means conducts to ground and the capacitor is discharged in the opposite direction through a resistor and the second of the pair of output transistors. The discharge current flowing through the second transistor is an exponential signal whose amplitude is proportional to the charge on the capacitor, and thus to the pulse width, wherein the duration of the pulse is based on a stationary reference edge of the respective pulse. The exponential signal is operatively coupled to a low pass filter to effect complete demodulation of the input signal.

BRIEF DESCRIPTION OF THE DRAWINGS

FIG. 1 is a schematic diagram exemplifying an implementation of a pulse width demodulator circuit of the invention combination.

FIGS. 2A, 2B and 2C are graphs depicting an input, an intermediate and an output waveform, respectively, of the circuit of FIG. 1.

DESCRIPTION OF THE PREFERRED EMBODIMENTS

In FIG. 2A, there is shown a typical input signal 10, herein corresponding to a pulse width modulated carrier wherein a (negative-going) reference edge 12 is stationary in time, and a (positive-going) data edge 14 is modulated in time to describe the intended signal. Thus, the time-variable pulse width, corresponding to the data, is represented by varying the time of occurrence of the data edge 14 with respect to the stationary edge 12.

FIG. 1 depicts a circuit, by way of example only, which is driven from emitter coupled logic operated at 5.2 volts. Thus, the input signal 10 of FIG. 2A is applied to input 16 and to the base of an input transistor 18, whose emitter is coupled to ground via a resistor 20, and to the positive 5.2 voltage via a resistor 22. The collector thereof is connected to the anode of a Schottky diode 24, to the base of a switch transistor 26, and to ground via a resistor 28. The emitter of switch transistor 26 is coupled to ground, and the collector thereof is coupled to the cathode of the Schottky diode 24, to a capacitor 30, and to the collector of a current source transistor 32. The emitter of transistor 32 is coupled to the positive 5.2 voltage via a resistor 34, and the base thereof is coupled to the anode of a Zener diode 36 and thence to the positive 5.2 voltage, as well as to ground via a resistor 38. The components 32, 34, 36 and 38 together define the constant current source.

The capacitor 30 is coupled via resistor 40 to the emitters of a pair of output transistors 42, 44. The collector of transistor 44 is coupled to a negative voltage, and the base is coupled to a biasing voltage source 46, and thence to ground. The base of output transistor 42 is grounded, and the collector thereof provides the output signal of the circuit, and is coupled to the positive 5.2 voltage via a resistor 48, as well as to a low pass filter 50. The output of filter 50 applied to output terminal 52 comprises the demodulated signal corresponding to the input signal of FIG. 2A.

In operation, and referring to both FIGS. 1 and 2, when the input signal 10 of FIG. 2A is low (e.g., at 3.4 volts), input transistor 18 conducts and causes switch transistor 26 to be turned on. The collector voltage of switch transistor 26 is thus near ground potential, and the current from the current source transistor 32 flows into the collector of switch transistor 26, which thus remains low (curve 54 of FIG. 2B).

When the input signal voltage goes high (e.g., 4.4 volts at time-variable data edge 14), the input and switch transistors 18, 26, respectively, are cut off, and the current from the current source transistor 32 flows into the capacitor 30 and proceeds to charge same. Output transistors 42, 44 are biased at the verge of conduction by biasing voltage source 46, whereby charging current flows through the capacitor 30 in a first direction and into the emitter of the output transistor 44. The charge developed across the capacitor 30 is proportional to the time during which the input signal voltage 10 is high, i.e., to the pulse width, as depicted by curves 54a 54b, 54c of FIG. 2B. When the input signal 10 voltage goes low again, as at the next stationary reference edge 12, the switch transistor 26 is again turned on, and the capacitor 30 discharges in the opposite direction through the emitter of the output transistor 42. The resistor 40 limits the peak discharge current to a safe level.

Thus, it may be seen that the pair of transistors 42, 44 define output switch means for charging the capacitor 30, and then for simultaneously reading and discharging the capacitor charge in accordance with the pulse width.

The current flowing into the emitter of the output transistor 42 is therefore an exponential signal with the time constant determined by the values of the capacitor 30 and the resistor 40 during the discharging process. The amplitude of the exponential signal, indicated by numerals 56a, 56b, 56c of FIG. 2C, is proportional to the charge on the capacitor 30 and thus to the pulse width which, in turn, represents the data. The time of occurrence of the exponential signal of FIG. 2C is determined by the position of the input signal stationary edge 12. That is, the output pulses 56a, 56b or 56c, etc., are always generated at equally spaced time periods, with each pulse being time coincident with its respective stationary edge 12 of the input signal, as shown in FIGS. 2A and 2C.

Since the collector current of the transistor 42 is very nearly equal to its emitter current, it is only necessary to apply the collector current of output transistor 42 (i.e., the curve 56 of FIG. 2C) to the low pass filter 50 to effect the complete demodulation of the input signal 10 of FIG. 2A.

The Schottky diode 24 is a clamping diode which prevents the switch transistor 26 from saturating so as to allow it to turn off very rapidly. The Zener diode 36 provides a bias to allow a constant current flow from the constant current transistor 32.

The amplitude of the demodulated signal on output 52 is directly proportional to the collector current of the current source transistor 32. Thus, the latter collector current may be controlled via feedback to provide an automatic gain control feature.

What is claimed is:

1. A demodulator circuit for demodulating high frequency pulse width modulated signals wherein the input signal information is represented by time-variable pulse widths, comprising the combination of;
    capacitor means for receiving a charge which is proportional to the input pulse width;
    output switch means coupled to the capacitor means for enabling the capacitor to charge in the presence of an input pulse, and for reading out the capacitor charge simultaneously with enabling the capacitor to discharge upon completion of the pulse; and
    wherein the discharge current represents the charge received by the capacitor means and thus the demodulated signal.

2. The circuit of claim 1 wherein the output switch means is biased on the verge of conduction to allow the capacitor means to charge via the switch means during the presence of the pulse, and to provide the simultaneous readout during the discharge of the capacitor means.

3. The circuit of claim 1 further including;
    means for charging the capacitor means in proportion to the input pulse width relative to a stationary reference edge thereof;
    wherein the discharge current defines an exponential output signal occurring coincident with the stationary reference edge and whose magnitude corresponds to the capacitor means charge; and
    filter means coupled to the discharge current path for reconstituting the demodulated signal.

4. The circuit of claim 3 wherein;
    the means for charging includes input switch transistor means for directing current flow to the capacitor means during the duration of the pulse; and
    the output switch means includes output switch transistor means coupled to the capacitor means for supplying the exponential output signal to the filter means at a constant spacing equal to the stationary reference edges.

5. The circuit of claim 4 wherein the means for charging further includes a current source transistor operatively coupled to the capacitor means in response to the input transistor switch means and to the duration of the pulse.

6. The circuit of claim 5 wherein the output switch transistor means includes a pair of output transistors coupled to the capacitor means and selectively biased on the verge of conductance in the absence of a pulse.

7. The circuit of claim 6 wherein a first output transistor of the pair provides a path for the charge current in the presence of a pulse, and the second output transistor provides a path for the discharge current upon completion of the pulse.

8. The circuit of claim 7 wherein the input transistor switch means is enabled in the absence of a pulse to couple the current source transistor to ground, and is disabled during the presence of the pulse to couple the current source transistor to the capacitor means.

9. The circuit of claim 8 wherein the output switch means includes;
    means for biasing the output transistors;
    wherein the first output transistor includes an emitter coupled to the capacitor means, a base coupled to the means for biasing, and a collector coupled to a selected voltage source; and
    the second output transistor includes an emitter coupled to the capacitor means, a base coupled to ground, and a collector coupled to a selected voltage source and to the filter means.

* * * * *